(12) United States Patent
Hsieh et al.

(10) Patent No.: US 7,125,742 B2
(45) Date of Patent: Oct. 24, 2006

(54) MULTI-PASSIVATION LAYER STRUCTURE FOR ORGANIC THIN-FILM TRANSISTORS AND METHOD FOR FABRICATING THE SAME

(75) Inventors: Cheng-Chung Hsieh, TaiChung (TW);
Jia-Chong Ho, Taipei (TW);
Tarng-Shiang Hu, Hsinchu (TW);
Cheng-Chung Lee, TaiTung (TW);
Liang-Ying Huang, Hsinchu (TW);
Wei-Ling Lin, NanTou (TW);
Wen-Kuei Huang, ChiaYi (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/863,212

(22) Filed: Jun. 9, 2004

(65) Prior Publication Data
US 2005/0227407 A1    Oct. 13, 2005

(30) Foreign Application Priority Data
Apr. 13, 2004    (TW) ............................... 93110168 A

(51) Int. Cl.
*H01L 51/40*    (2006.01)
*H01L 29/08*    (2006.01)
*H01L 35/24*    (2006.01)
*H01L 51/00*    (2006.01)
*H01L 31/062*   (2006.01)

(52) U.S. Cl. .................. 438/99; 438/149; 438/151; 438/82; 257/40; 257/290; 257/E51.007; 257/E21.255; 257/E21.582; 257/E21.272

(58) Field of Classification Search ............... 438/99, 438/499, 3, 149, 158, 240, 216, 151, 82; 257/40, 290
See application file for complete search history.

(56) References Cited

U.S. PATENT DOCUMENTS

| | | | |
|---|---|---|---|
| 6,344,662 B1* | 2/2002 | Dimitrakopoulos et al. | 257/40 |
| 6,506,438 B1* | 1/2003 | Duthaler et al. | 427/58 |
| 6,518,949 B1* | 2/2003 | Drzaic | 345/107 |
| 6,842,657 B1* | 1/2005 | Drzaic et al. | 700/120 |
| 7,045,257 B1* | 5/2006 | Hatakeyama et al. | 430/7 |
| 2003/0178936 A1* | 9/2003 | Park et al. | 313/505 |
| 2004/0247814 A1* | 12/2004 | Sirringhaus et al. | 428/64.1 |
| 2005/0062066 A1* | 3/2005 | Bao et al. | 257/202 |
| 2005/0272212 A1* | 12/2005 | Ho et al. | 438/301 |

* cited by examiner

*Primary Examiner*—B. William Baumeister
*Assistant Examiner*—Igwe U. Anya
(74) *Attorney, Agent, or Firm*—Troxell Law Office, PLLC

(57) ABSTRACT

The present invention discloses a multi-passivation layer structure for organic thin-film transistors and a method for fabricating the same by spin coating, inject printing, screen printing and micro-contact on organic thin-film transistors. The multi-passivation layer structure for organic thin-film transistors, comprising: a substrate; a gate layer formed on the substrate; an insulator layer formed on the substrate and the gate layer; an electrode layer formed on the insulator layer; a semiconductor layer formed on the insulator layer and the electrode layer; and a passivation layer formed on the semiconductor layer and the electrode layer, thereby forming a multi-passivation layer structure for organic thin-film transistors.

24 Claims, 10 Drawing Sheets

MULTI-PASSIVATION LAYER STRUCTURE FOR ORGANIC THIN-FILM TRANSISTORS AND METHOD FOR FABRICATING THE SAME

FIELD OF THE INVENTION

The present invention generally relates to a multi-passivation layer structure for organic thin-film transistors and a method for fabricating the same and, more particularly, to a method for forming a multi-passivation layer structure by spin coating, inject printing, screen printing and micro-contact on organic thin-film transistors.

DESCRIPTION OF THE PRIOR ART

In recent years, organic thin-film transistors (OTFT's) have been widely used in driving circuits for the active-type liquid crystal display, which is advantageous in compactness, low power consumption, low radiation, full color availability, etc. and thus has become a main stream product in the market. The applications of the liquid crystal displays include portable personal computers, televisions, video games, electronic dictionaries, portable calculators, car-use global positioning systems, and mobile phones, etc. The OTFT employs organic materials so as to make smart cards, RFID tags possible.

Moreover, the OTFT can also be applicable to flexible substrates, displays, and electronic papers with ease and low cost. Therefore, it has great potential in business as long as its lifetime meets the industrial requirement. Conventionally, the OTFT falls short of a good passivation layer and that is why it still cannot compete with the inorganic TFT even though the former exhibits better electric performance. Once the passivation layer is improved, the low-cost and large-area electronic devices can be implemented by using organic TFTs.

In the present invention, a multi-passivation layer structure for organic thin-film transistors is formed using organic and/or inorganic materials by spin coating, inject printing, screen printing and micro-contact. Conventionally, a single passivation layer on the OTFT can only prevent damages from the air. With the multi-passivation layer structure on the OTFT, the damages during LCD manufacturing process can also be avoided.

Pennsylvania State University discloses a passivation layer using PVA on the OTFT and Philips Research provides a passivation layer for polymer dispersed liquid crystal (PDLC) using PVP formed on Poly thienylenevinylene (PTV). In the present invention, a passivation layer on the pentacence for use with twisted nematic liquid crystal (TNLC) displays.

SUMMARY OF THE INVENTION

It is the primary object of the present invention to provide a multi-passivation layer structure for organic thin-film transistors such that the OTFT can be prevented from damages due to poor-quality passivation layer.

It is another object of the present invention to provide a method for fabricating multi-passivation layer structure for organic thin-film transistors such that the OTFT can be prevented from damages due to follow-up fabricating steps.

In order to achieve the foregoing objects, the present invention provides a multi-passivation layer structure for organic thin-film transistors, comprising: a substrate; a gate layer formed on said substrate; an insulator layer formed on said substrate and said gate layer; an electrode layer formed on said insulator layer; a semiconductor layer formed on said insulator layer and said electrode layer; and a passivation layer formed on said semiconductor layer and said electrode layer, thereby forming a multi-passivation layer structure for organic thin-film transistors.

The present invention further provides a method for fabricating a multi-passivation layer structure for organic thin-film transistors, comprising steps of:
  forming a gate layer on a substrate;
  forming an insulator layer on said substrate;
  forming an electrode layer on said insulator layer;
  forming a semiconductor layer on said insulator layer and said electrode layer; and
  spin coating a passivation layer on said semiconductor layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a method and a device for fabricating a multi-passivation layer structure for organic thin-film transistors can be exemplified by the preferred embodiments as described hereinafter.

(First Embodiment)

Please refer to FIG. 1A to FIG. 1I, which illustrate schematic diagrams showing steps in the method for fabricating a multi-passivation layer structure for organic thin-film transistors according to a first embodiment of the present invention. These steps are described hereinafter.

Figure 1I:
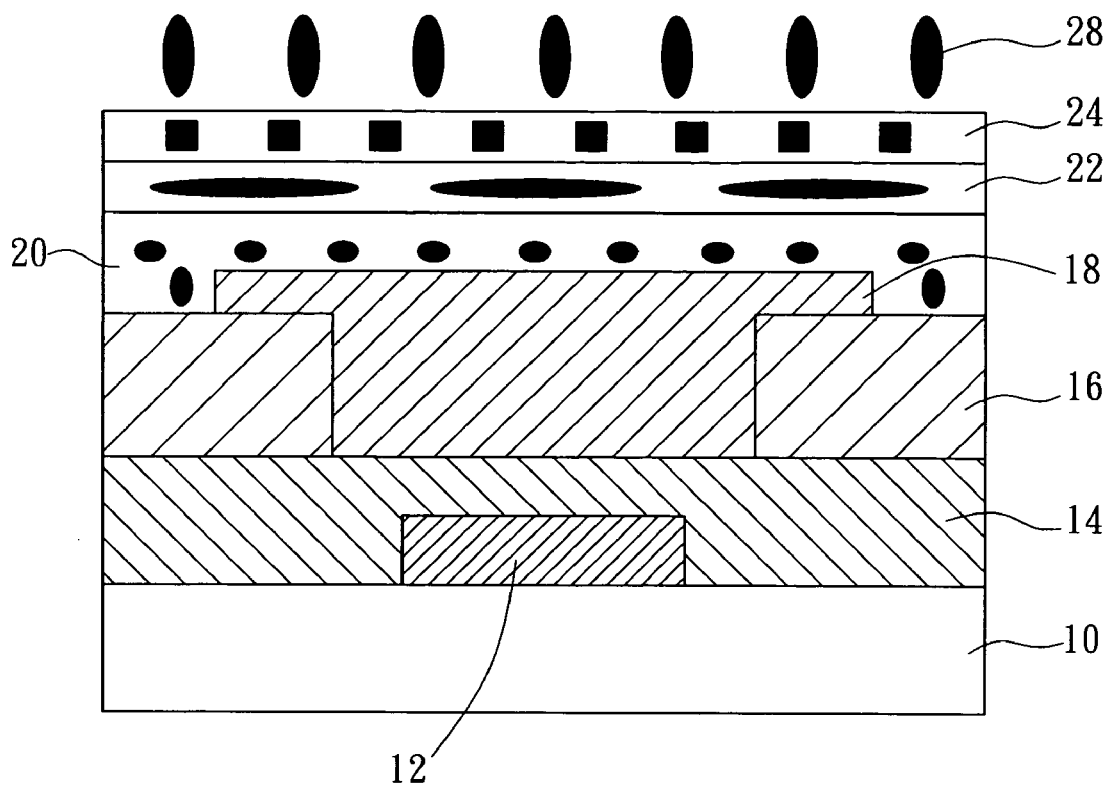
FIG. 1I is a schematic diagram showing another step of testing after fabricating a multi-passivation layer structure for organic thin-film transistors according to a first embodiment of the present invention.
Figure 1:
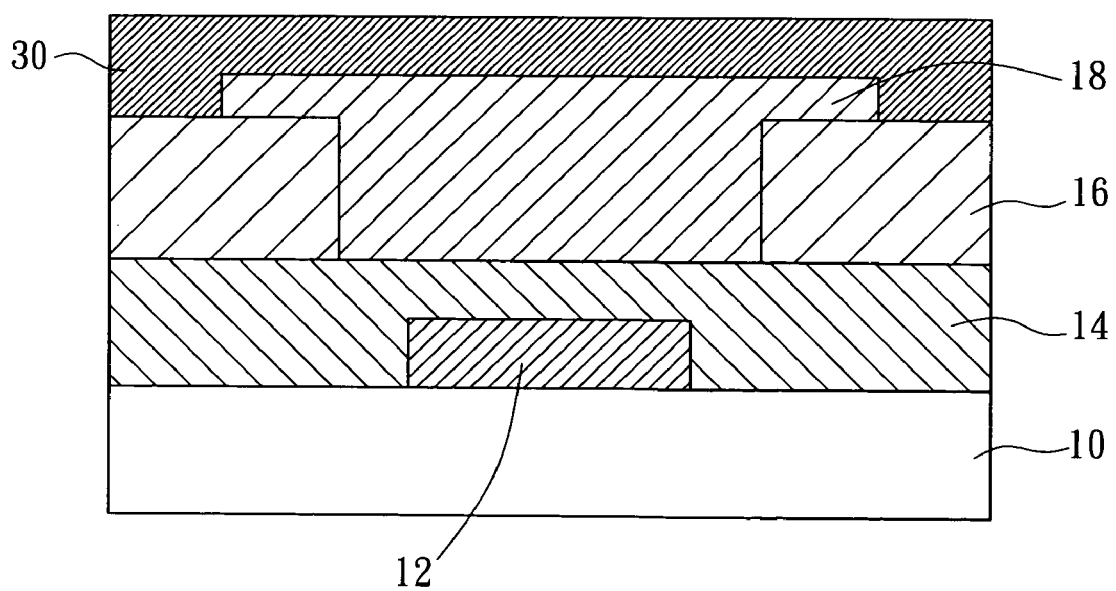
FIG. 1 is a schematic diagram showing a cross-sectional multi-passivation layer structure for organic thin-film transistors according to a first embodiment of the present invention.
Figure 1A:
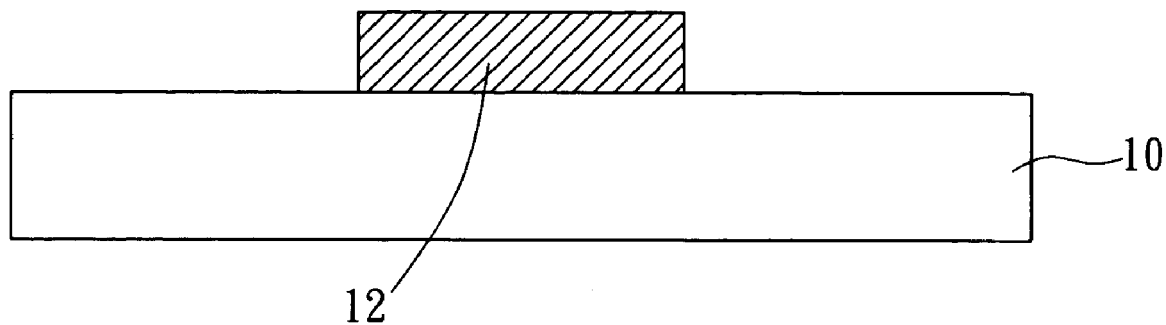
FIG. 1A is a schematic diagram showing a first step in the method for fabricating a multi-passivation layer structure for organic thin-film transistors according to a first embodiment of the present invention.

Please refer to FIG. 1A, which is a schematic diagram showing a first step in the method for fabricating a multi-passivation layer structure for organic thin-film transistors according to a first embodiment of the present invention. In FIG. 1A, a gate layer 12 is formed on a substrate 10. The substrate 10 is not limited to a silicon substrate or a glass substrate, and the gate layer 12 is the gate electrode for the organic thin-film transistor.

Figure 1B:
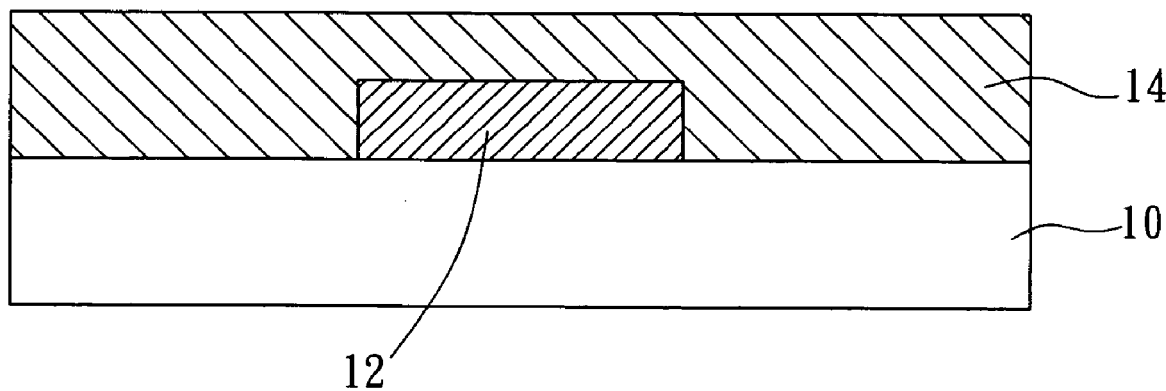
FIG. 1B is a schematic diagram showing a second step in the method for fabricating a multi-passivation layer structure for organic thin-film transistors according to a first embodiment of the present invention.

FIG. 1B is a schematic diagram showing a second step in the method for fabricating a multi-passivation layer structure for organic thin-film transistors according to a first embodiment of the present invention. In FIG. 1B, an insulator layer 14 is formed on the substrate 10 and the gate layer 12. The insulator layer 14 is formed of an organic polymer or inorganic materials by deposition or printing.

Figure 1C:
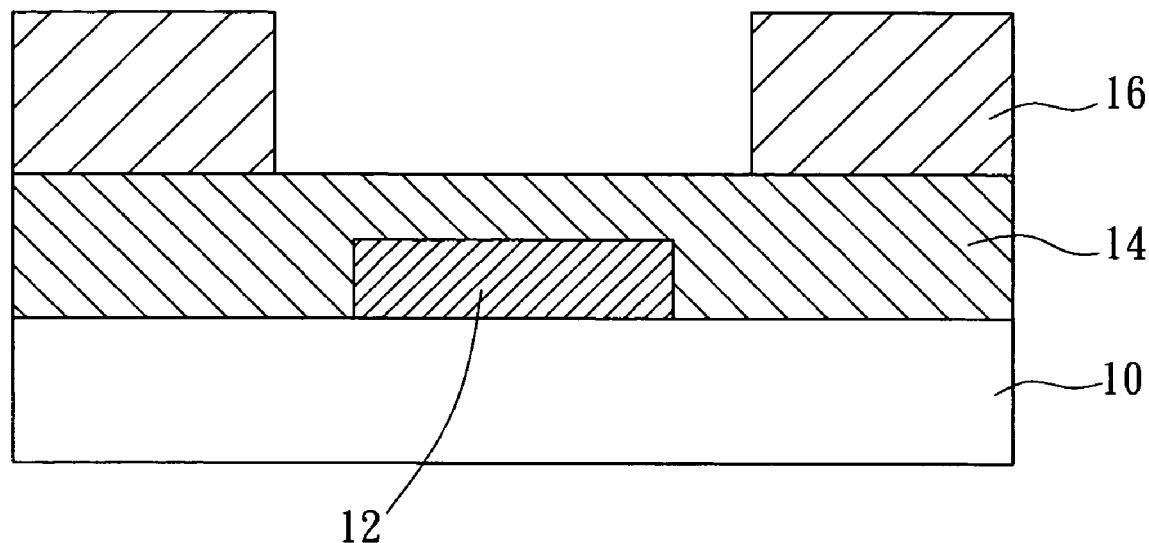
FIG. 1C is a schematic diagram showing a third step in the method for fabricating a multi-passivation layer structure for organic thin-film transistors according to a first embodiment of the present invention.

FIG. 1C is a schematic diagram showing a third step in the method for fabricating a multi-passivation layer structure for organic thin-film transistors according to a first embodiment of the present invention. In FIG. 1C, an electrode layer 16 is formed on the insulator layer 14. The electrode layer 16 is formed of an electrically conductive material formed of at least one of an organic polymer or inorganic materials.

Figure 1D:
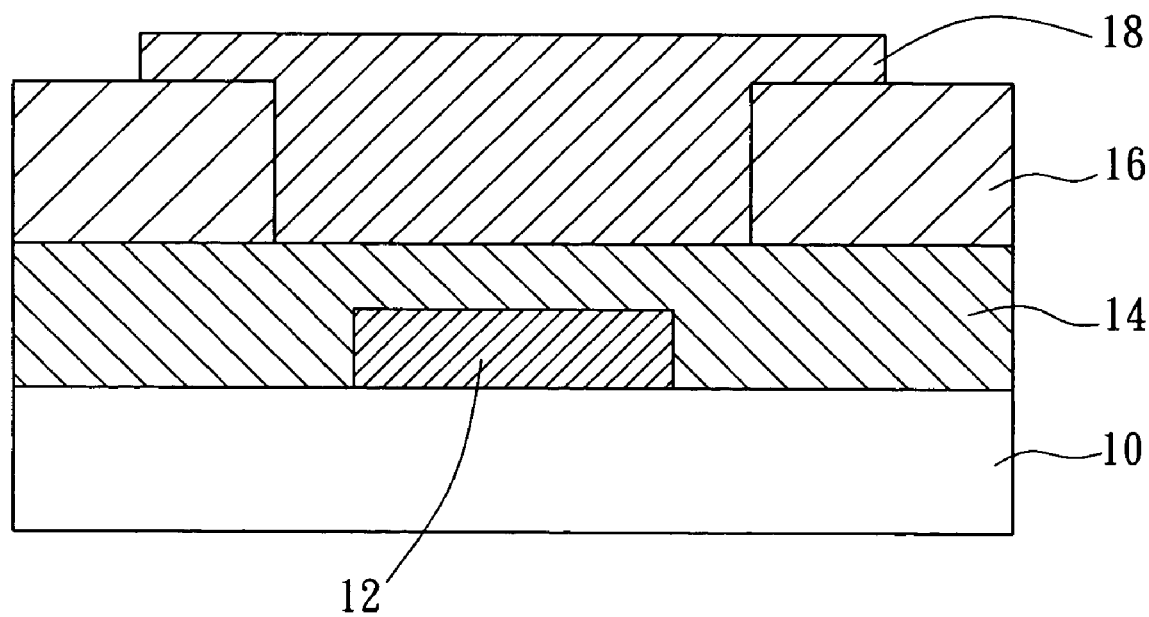
FIG. 1D is a schematic diagram showing a fourth step in the method for fabricating a multi-passivation layer structure for organic thin-film transistors according to a first embodiment of the present invention.

FIG. 1D is a schematic diagram showing a fourth step in the method for fabricating a multi-passivation layer structure for organic thin-film transistors according to a first embodiment of the present invention. In FIG. 1D, a semiconductor layer 18 is formed on the insulator layer 14 and the electrode layer 16. The semiconductor layer 18 is formed of an organic semiconductor material by spin coating or evaporation.

Figure 1E:
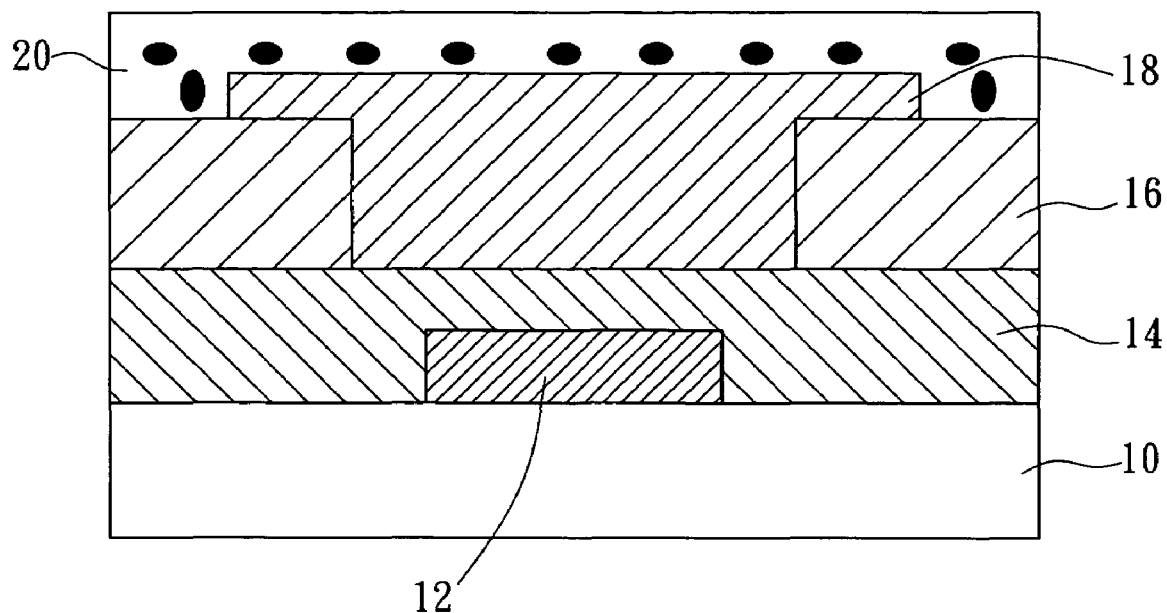
FIG. 1E is a schematic diagram showing a fifth step in the method for fabricating a multi-passivation layer structure for organic thin-film transistors according to a first embodiment of the present invention.

FIG. 1E is a schematic diagram showing a fifth step in the method for fabricating a multi-passivation layer structure for organic thin-film transistors according to a first embodiment of the present invention. In FIG. 1E, a passivation layer 20 is formed on the electrode layer 16. The passivation layer 20 is formed of a solution of dichromated gelatin (DCG) mixed with polyviny alcohol (PVA) by spin coating on an organic transistor electrically tested and then being exposed and patterned.

Figure 1F:
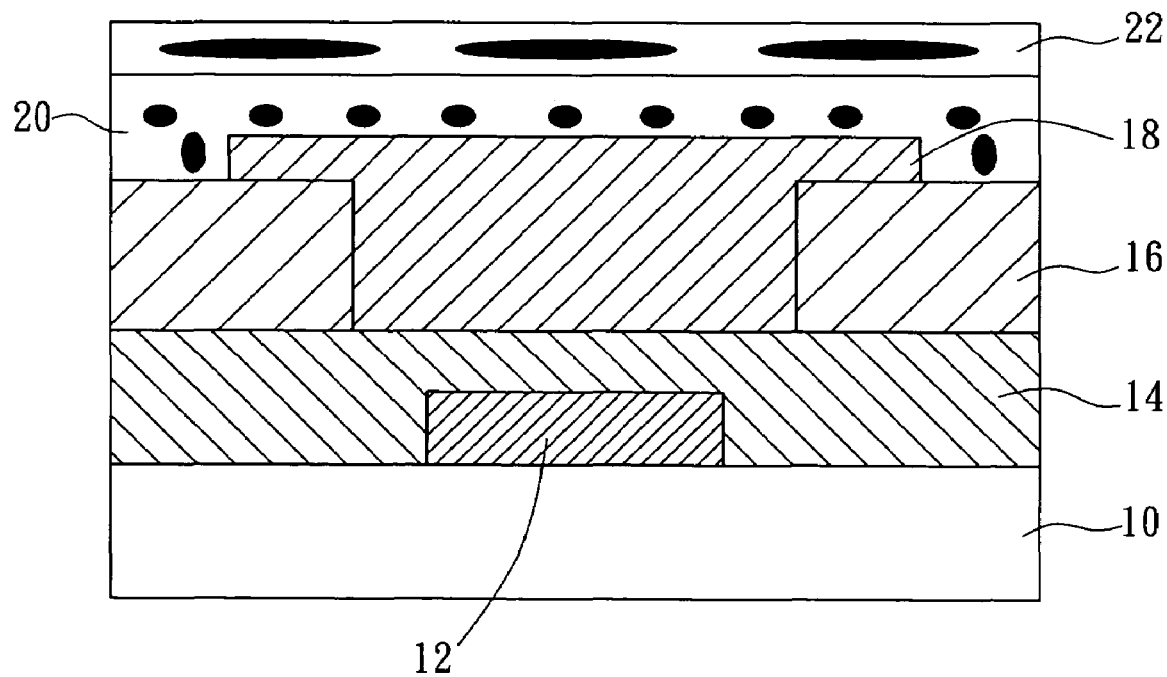
FIG. 1F is a schematic diagram showing a sixth step in the method for fabricating a multi-passivation layer structure for organic thin-film transistors according to a first embodiment of the present invention.

FIG. 1F is a schematic diagram showing a sixth step in the method for fabricating a multi-passivation layer structure for organic thin-film transistors according to a first embodiment of the present invention. In FIG. 1F, a second passivation layer 22 is formed on the passivation layer 20. The second passivation layer 22 is formed of a solution of polyvinyl phenol (PVP) by spin coating on polyviny alcohol (PVA) and then being exposed and patterned.

Figure 1G:
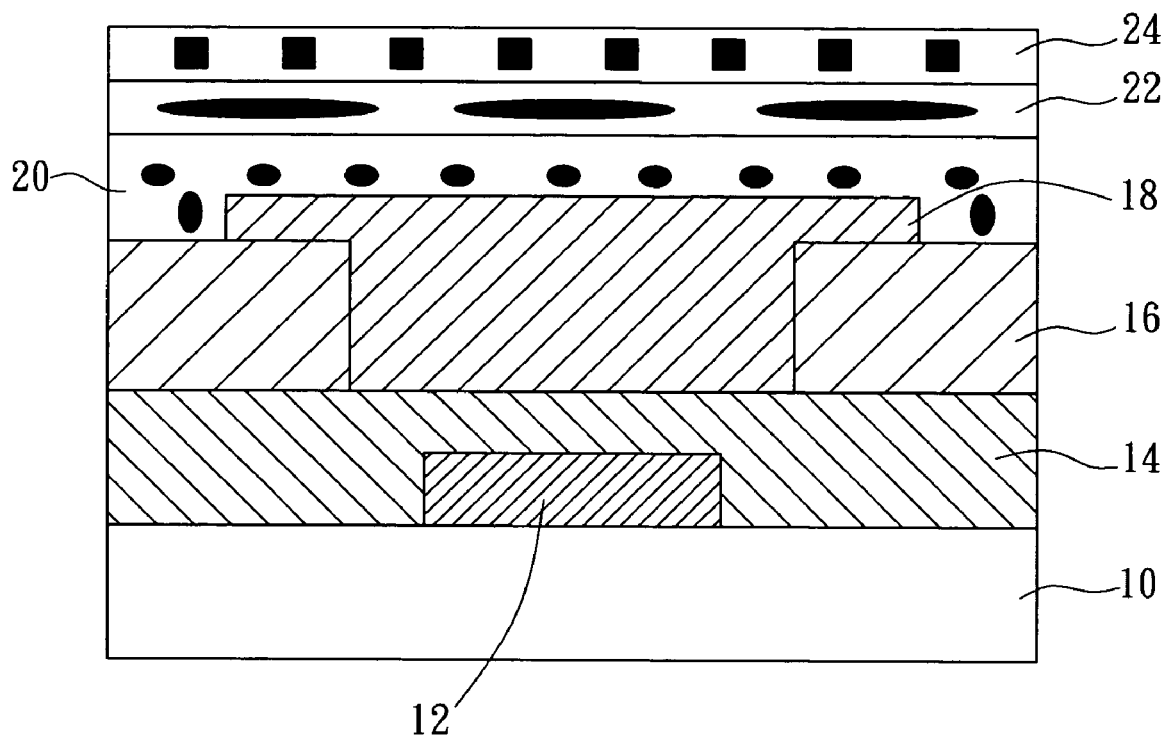
FIG. 1G is a schematic diagram showing a seventh step in the method for fabricating a multi-passivation layer structure for organic thin-film transistors according to a first embodiment of the present invention.

FIG. 1G is a schematic diagram showing a seventh step in the method for fabricating a multi-passivation layer structure for organic thin-film transistors according to a first embodiment of the present invention. In FIG. 1G, a third passivation layer 24 is formed on the second passivation layer 22. The third passivation layer 24 is formed of a solution of polyimide (PI) by spin coating on polyvinyl phenol (PVP) and then being exposed and patterned.

Figure 1H:
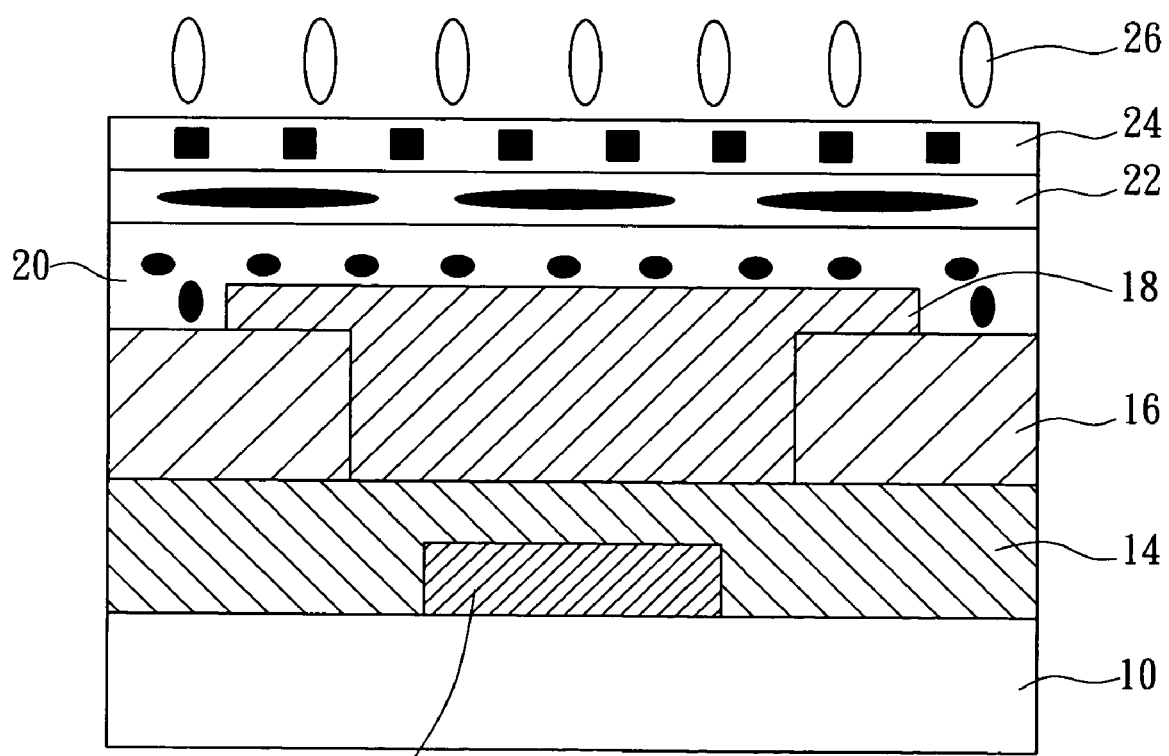
FIG. 1H is a schematic diagram showing a step of testing after fabricating a multi-passivation layer structure for organic thin-film transistors according to a first embodiment of the present invention.

FIG. 1H is a schematic diagram showing a step of testing after fabricating a multi-passivation layer structure for organic thin-film transistors according to a first embodiment of the present invention. In FIG. 1H, a twisted nematic liquid crystal (TNLC) solution 26 is dripped on a multi-passivation layer structure 30, and then the organic transistor is tested to be unaffected.

FIG. 1I is a schematic diagram showing another step of testing after fabricating a multi-passivation layer structure for organic thin-film transistors according to a first embodiment of the present invention. In FIG. 1I, a polymer dispersed matrix liquid crystal (PDMLC) solution 28 is dripped on a multi-passivation layer structure 30, and then the organic transistor is tested to be unaffected.

Please refer to FIG. 1, which is a schematic diagram showing a cross-sectional multi-passivation layer structure for organic thin-film transistors according to a first embodiment of the present invention. The multi-passivation layer structure for organic thin-film transistors comprises: a substrate 10; a gate layer 12 formed on the substrate 10; an insulator layer 14 formed on the substrate 10 and the gate layer 12; an electrode layer 16 formed on the insulator layer 14; a semiconductor layer 18 formed on the insulator layer 14 and the electrode layer 16; and a passivation layer 30 formed on the semiconductor layer 18 and the electrode layer 16, thereby forming a multi-passivation layer structure for organic thin-film transistors.

(Second Embodiment)

Please refer to FIG. 2A to FIG. 2I, which illustrate schematic diagrams showing steps in the method for fabricating a multi-passivation layer structure for organic thin-film transistors according to a second embodiment of the present invention. These steps are described hereinafter.

Figure 2I:
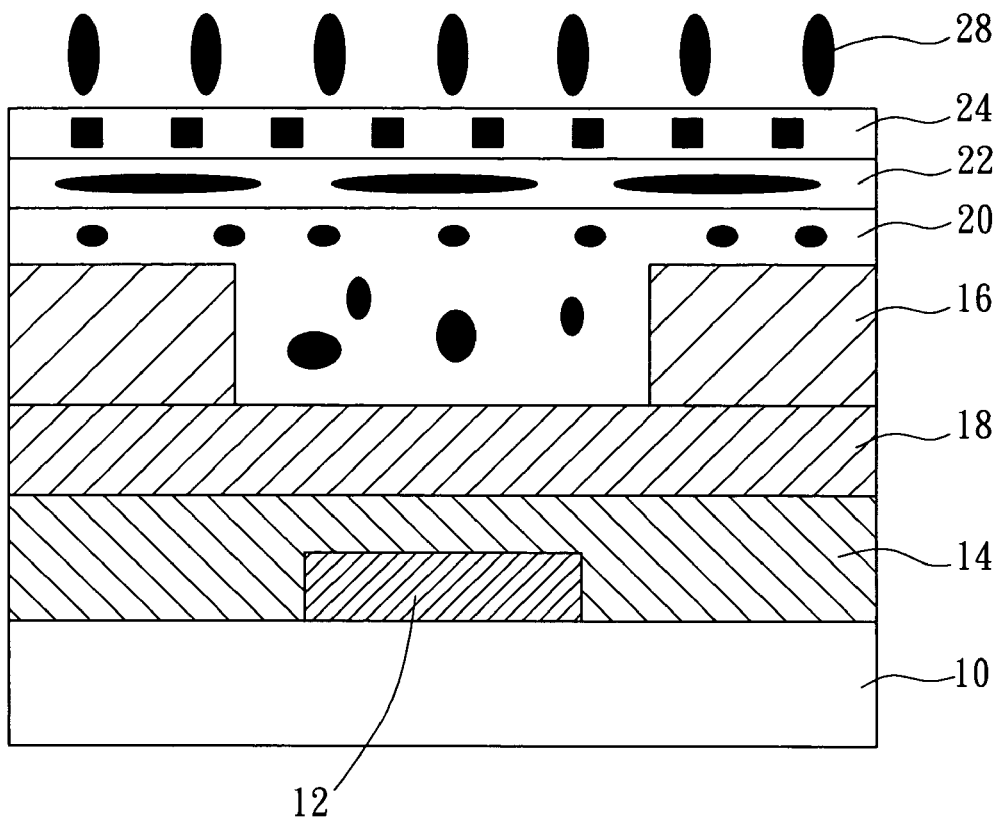
FIG. 2I is a schematic diagram showing another step of testing after fabricating a multi-passivation layer structure for organic thin-film transistors according to a second embodiment of the present invention.
Figure 2:
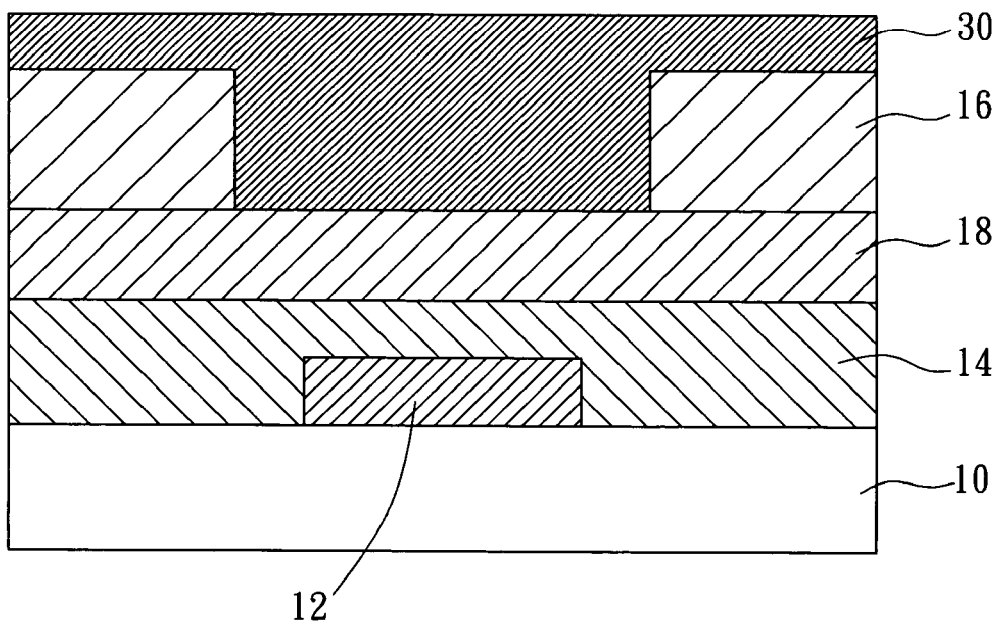
FIG. 2 is a schematic diagram showing a cross-sectional multi-passivation layer structure for organic thin-film transistors according to a second embodiment of the present invention.
Figure 2A:
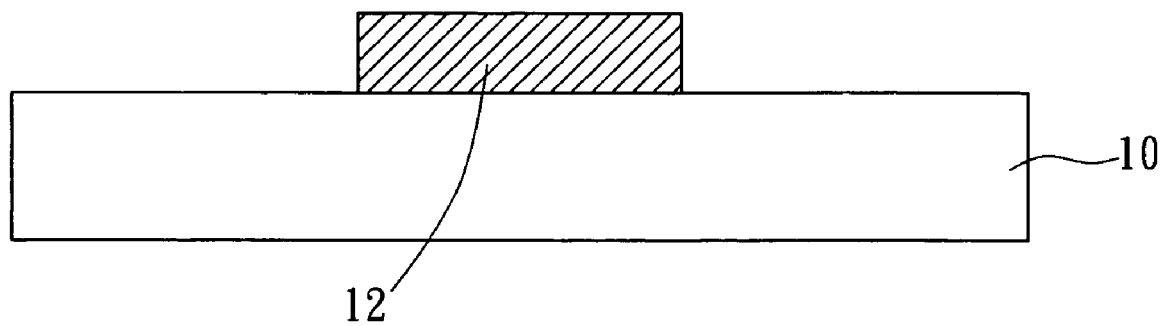
FIG. 2A is a schematic diagram showing a first step in the method for fabricating a multi-passivation layer structure for organic thin-film transistors according to a second embodiment of the present invention.

Please refer to FIG. 2A, which is a schematic diagram showing a first step in the method for fabricating a multi-passivation layer structure for organic thin-film transistors according to a second embodiment of the present invention. In FIG. 2A, a gate layer 12 is formed on a substrate 10. The substrate 10 is not limited to a silicon substrate or a glass substrate, and the gate layer 12 is the gate electrode for the organic thin-film transistor.

Figure 2B:
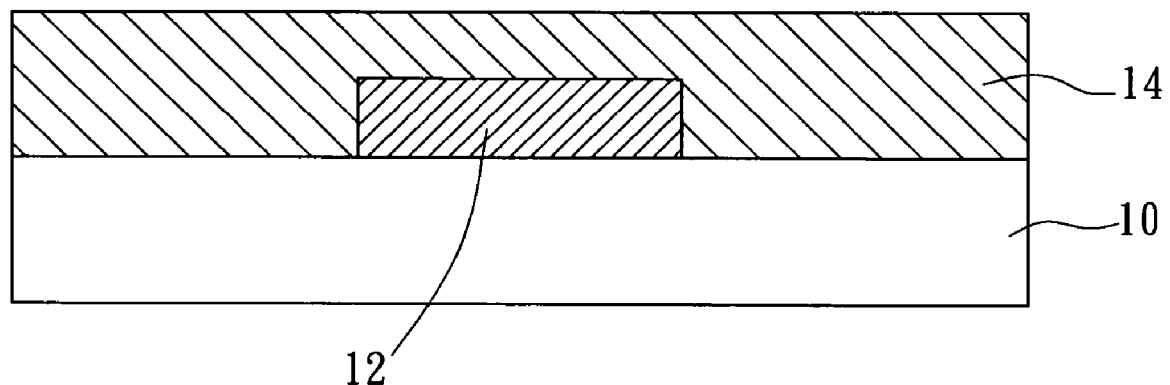
FIG. 2B is a schematic diagram showing a second step in the method for fabricating a multi-passivation layer structure for organic thin-film transistors according to a second embodiment of the present invention.

FIG. 2B is a schematic diagram showing a second step in the method for fabricating a multi-passivation layer structure for organic thin-film transistors according to a second embodiment of the present invention. In FIG. 2B, an insulator layer 14 is formed on the substrate 10 and the gate layer 12. The insulator layer 14 is formed of an organic polymer or inorganic materials by deposition or printing.

Figure 2C:
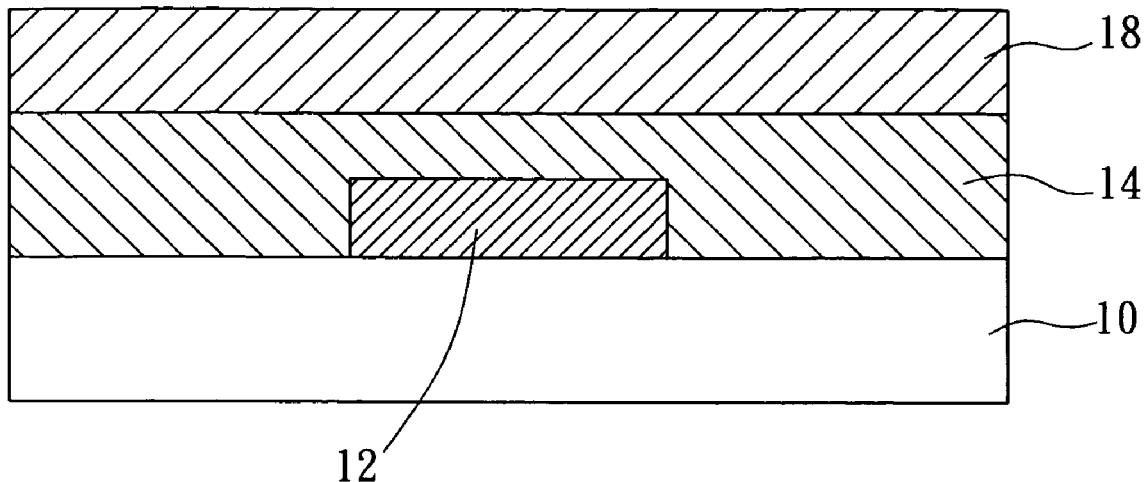
FIG. 2C is a schematic diagram showing a third step in the method for fabricating a multi-passivation layer structure for organic thin-film transistors according to a second embodiment of the present invention.

FIG. 2C is a schematic diagram showing a third step in the method for fabricating a multi-passivation layer structure for organic thin-film transistors according to a second embodiment of the present invention. In FIG. 2C, a semiconductor layer 18 is formed on the insulator layer 14. The semiconductor layer 18 is formed of an organic semiconductor material by spin coating or evaporation.

Figure 2D:
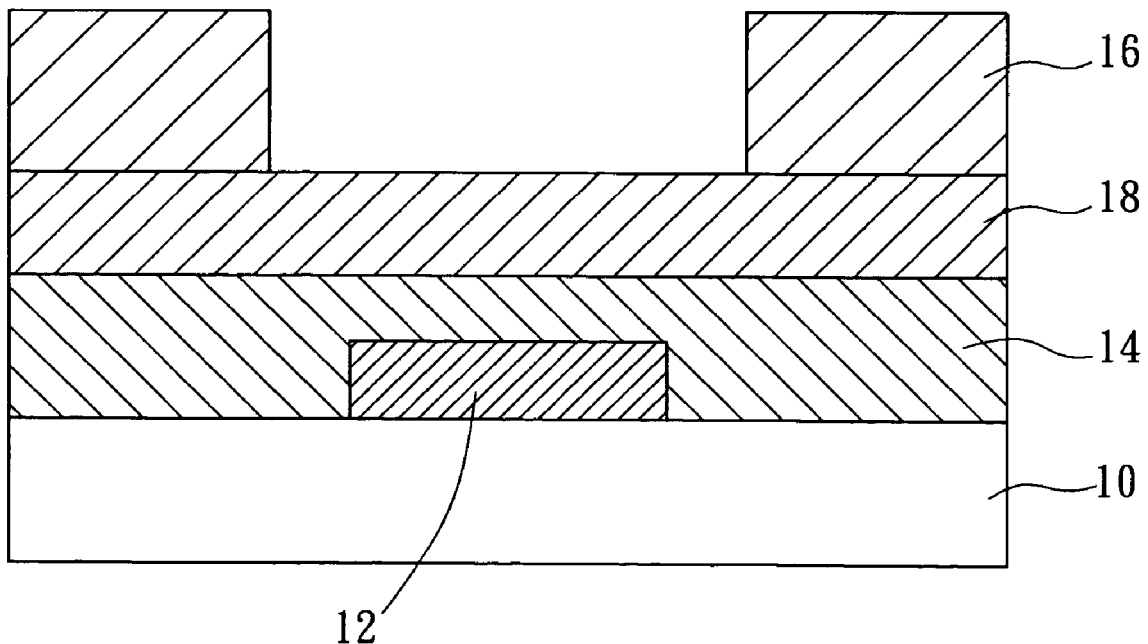
FIG. 2D is a schematic diagram showing a fourth step in the method for fabricating a multi-passivation layer structure for organic thin-film transistors according to a second embodiment of the present invention.

FIG. 2D is a schematic diagram showing a fourth step in the method for fabricating a multi-passivation layer structure for organic thin-film transistors according to a second embodiment of the present invention. In FIG. 2D, an electrode layer 16 is formed on the semiconductor layer 18. The electrode layer 16 is formed of an electrically conductive material formed of at least one of an organic polymer or inorganic materials.

Figure 2E:
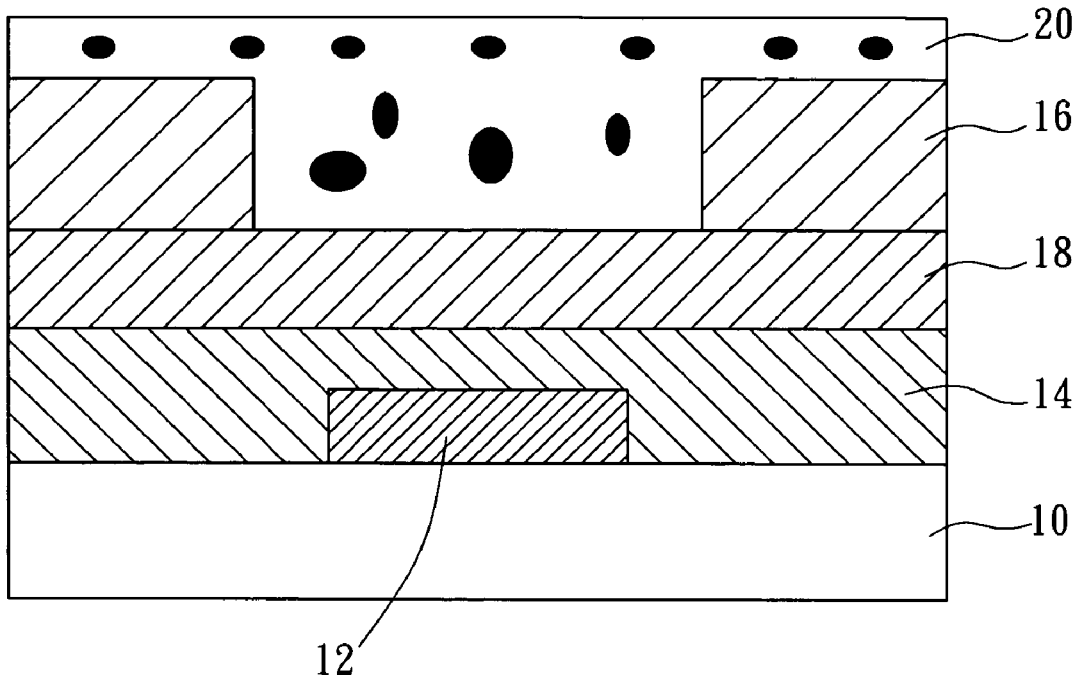
FIG. 2E is a schematic diagram showing a fifth step in the method for fabricating a multi-passivation layer structure for organic thin-film transistors according to a second embodiment of the present invention.

FIG. 2E is a schematic diagram showing a fifth step in the method for fabricating a multi-passivation layer structure for organic thin-film transistors according to a second embodiment of the present invention. In FIG. 2E, a passivation layer 20 is formed on the electrode layer 16. The passivation layer 20 is formed of a solution of dichromated gelatin (DCG) mixed with polyviny alcohol (PVA) by spin coating on an organic transistor electrically tested and then being exposed and patterned.

Figure 2F:
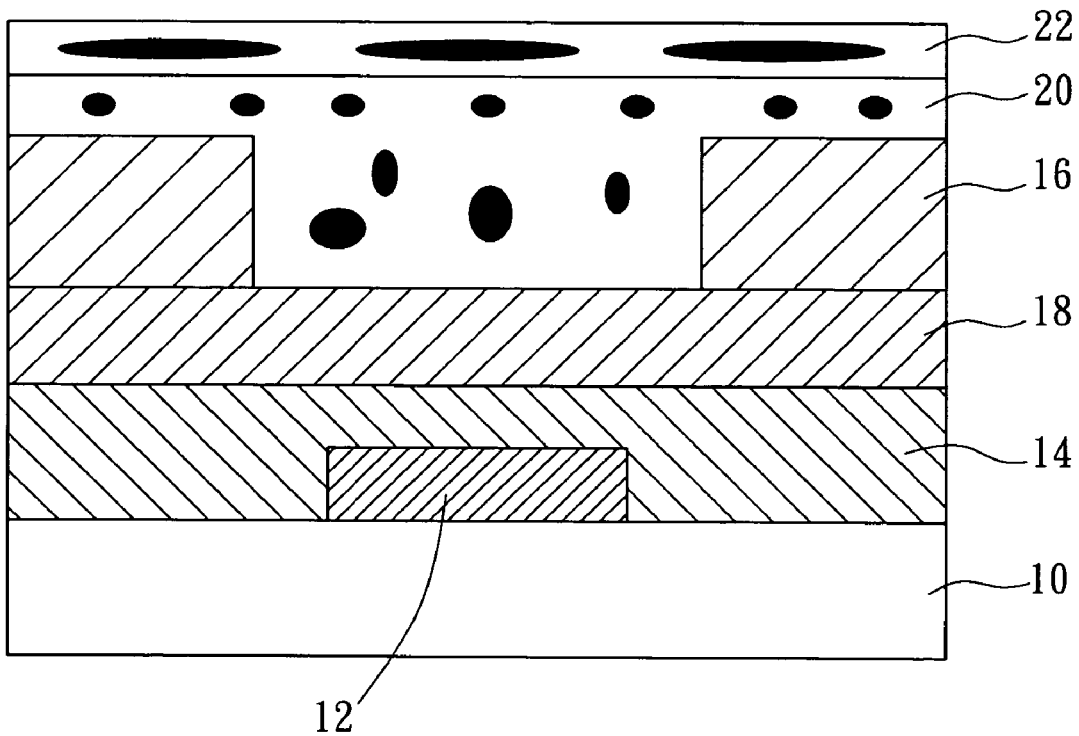
FIG. 2F is a schematic diagram showing a sixth step in the method for fabricating a multi-passivation layer structure for organic thin-film transistors according to a second embodiment of the present invention.

FIG. 2F is a schematic diagram showing a sixth step in the method for fabricating a multi-passivation layer structure for organic thin-film transistors according to a second embodiment of the present invention. In FIG. 2F, a second passivation layer 22 is formed on the passivation layer 20. The second passivation layer 22 is formed of a solution of polyvinyl phenol (PVP) by spin coating on polyviny alcohol (PVA) and then being exposed and patterned.

Figure 2G:
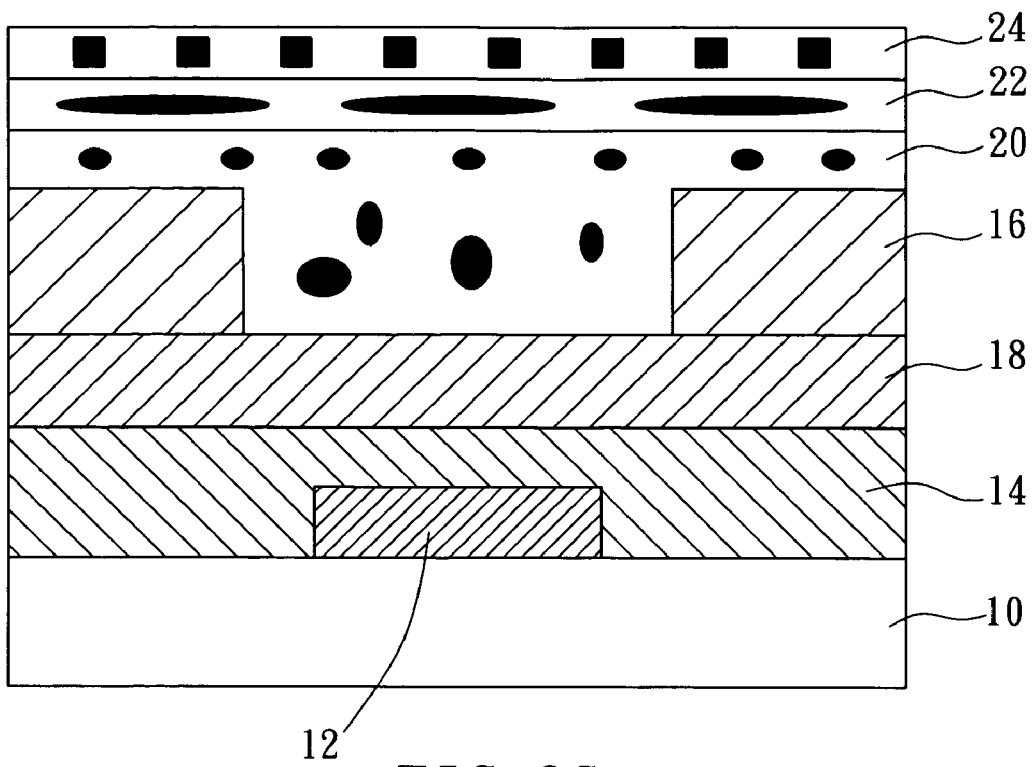
FIG. 2G is a schematic diagram showing a seventh step in the method for fabricating a multi-passivation layer structure for organic thin-film transistors according to a second embodiment of the present invention.

FIG. 2G is a schematic diagram showing a seventh step in the method for fabricating a multi-passivation layer structure for organic thin-film transistors according to a second embodiment of the present invention. In FIG. 2G, a third passivation layer 24 is formed on the second passivation layer 22. The third passivation layer 24 is formed of a solution of polyimide (PI) by spin coating on polyvinyl phenol (PVP) and then being exposed and patterned.

Figure 2H:
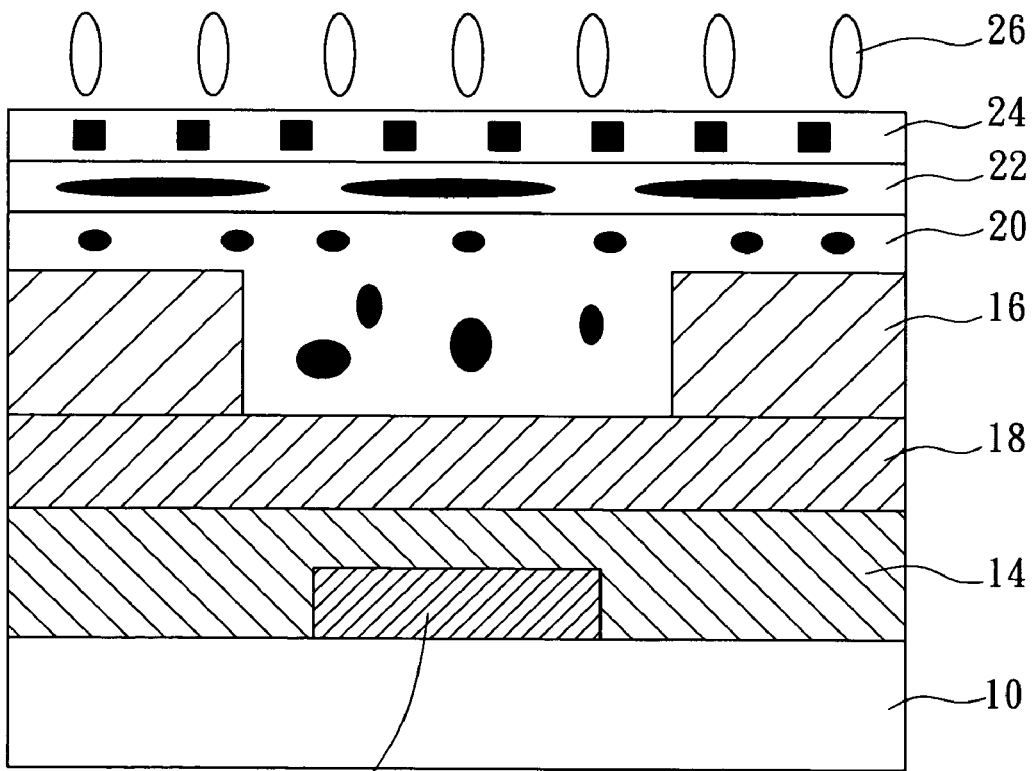
FIG. 2H is a schematic diagram showing a step of testing after fabricating a multi-passivation layer structure for organic thin-film transistors according to a second embodiment of the present invention.

FIG. 2H is a schematic diagram showing a step of testing after fabricating a multi-passivation layer structure for organic thin-film transistors according to a second embodiment of the present invention. In FIG. 2H, a twisted nematic liquid crystal (TNLC) solution is dripped on a multi-passivation layer structure 30, and then the organic transistor is tested to be unaffected.

FIG. 2I is a schematic diagram showing another step of testing after fabricating a multi-passivation layer structure for organic thin-film transistors according to a second embodiment of the present invention. In FIG. 2I, a polymer dispersed matrix liquid crystal (PDMLC) solution is dripped on a multi-passivation layer structure 30, and then the organic transistor is tested to be unaffected.

Please refer to FIG. 2, which is a schematic diagram showing a cross-sectional multi-passivation layer structure for organic thin-film transistors according to a second embodiment of the present invention. The multi-passivation layer structure for organic thin-film transistors comprises: a substrate 10; a gate layer 12 formed on the substrate 10; an insulator layer 14 formed on the substrate 10 and the gate layer 12; a semiconductor layer 18 formed on the insulator layer 14; an electrode layer 16 formed on the semiconductor layer 18; and a passivation layer 30 formed on the semiconductor layer 18 and the electrode layer 16, thereby forming a multi-passivation layer structure for organic thin-film transistors.

According to the above discussion, the present invention discloses a multi-passivation layer structure for organic thin-film transistors and a method for fabricating the same, such that the OTFT can be prevented from damages due to poor-quality passivation layer. Therefore, the present invention has been examined to be new, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for fabricating a multi-passivation layer structure for organic thin-film transistors, comprising the steps of:
   forming a gate layer on a substrate;
   forming a insulator layer on said substrate;
   forming a electrode layer on said insulator layer;
   forming a semiconductor layer on said insulator layer and said electrode layer; and
   forming a multi-passivation layer including forming a first passivation layer on said semiconductor layer, forming a second passivation layer on said first passivation layer, and forming a third passivation layer on said second passivation layer, wherein said multi-passivation layer structure is formed of PVA and PVP and said first passivation layer is formed from PVA.

2. The method for fabricating a multi-passivation layer structure as recited in claim 1, wherein said multi-passivation layer is formed by one of spin coating, injet printing, screen printing and micro contact.

3. The method for fabricating a multi-passivation layer structure as recited in claim 1, wherein said second passivation layer of said multi-passivation layer is formed of one selected from an organic solution, an inorganic solution and combination thereof.

4. The method for fabricating a multi-passivation layer structure as recited in claim 1, wherein said multi-passivation layer structure is a passivation layer for a pentancne transistor.

5. The method for fabricating a multi-passivation layer structure as recited in claim 1, wherein said multi-passivation layer structure is a passivation layer for a pentancne transistor.

6. The method for fabricating a multi-passivation layer structure as recited in claim 1, wherein said first passivation layer of said multi-passivation layer structure is formed of a water-type solution.

7. The method forfabricating a multi-passivation layer structure as recited in claim 1, wherein said second and said third passivation layers of said multi-passivation layer structure is formed of a grease-type solution.

8. The method for fabricating a multi-passivation layer structure as recited in claim 1, wherein said second and said third passivation layers of said multi-passivation layer structure is formed of a mixture of a water-type solution and a grease-type solution.

9. A multi-passivation layer structure for organic thin-film transistors, comprising:
   a substrate;
   a gate layer formed on said substrate;
   an insulator layer formed on said substrate and said gate layer;
   an electrode layer formed on said insulator layer;
   a semiconductor layer formed on said insulator layer and said electrode layer;
   a first passivation layer formed on said semiconductor layer and said electrode layer;
   a second passivation layer formed on said first passivation layer; and
   a third passivation layer formed on said second passivation layer, wherein said multi-passivation layer structure is formed of PVA and PVP and said first passivation layer is formed from PVA.

10. The multi-passivation layer structure as recited in claim 9, wherein said passivation layer is formed by one of spin coating, injet printing, screen printing and micro contact.

11. The multi-passivation layer structure as recited in claim 9, wherein said second passivation layer of said passivation layer is formed of one selected from an organic solution, an inorganic solution and combination thereof.

12. The multi-passivation layer structure as recited in claim 9, wherein said multi-passivation layer structure is a passivation layer for a pentancne transistor.

13. The multi-passivation layer structure as recited in claim 9, wherein said multi-passivation layer structure is a passivation layer for a pentancne transistor.

14. The multi-passivation layer structure as recited in claim 9, wherein said first passivation layer of said multi-passivation layer structure is formed of a water-type solution.

15. The multi-passivation layer structure as recited in claim 9, wherein said second and said third passivation layers of said multi-passivation layer structure is formed of a grease-type solution.

16. The multi-passivation layer structure as recited in claim 9, wherein said second and said third passivation layers of said multi-passivation layer structure is formed of a mixture of a water-type solution and a grease-type solution.

17. A multi-passivation layer structure for organic thin-film transistors, comprising:
   a substrate;
   a gate layer formed on said substrate;
   an insulator layer formed on said substrate and said gate layer;
   a semiconductor layer formed on said insulator layer;
   an electrode layer formed on said semiconductor layer;
   a first passivation layer formed on said semiconductor layer and said electrode layer;
   a second passivation layer formed on said first passivation layer; and
   a third passivation layer formed on said second passivation layer, wherein said multi-passivation layer structure is formed of PVA and PVP and the said first passivation layer is formed from PVA.

18. The multi-passivation layer structure as recited in claim 17, wherein said passivation layer is formed by one of spin coating, injet printing, screen printing and micro contact.

19. The multi-passivation layer structure as recited in claim 17, wherein said second passivation layer of said passivation layer is formed of one selected from an organic solution, an inorganic solution and combination thereof.

20. The multi-passivation layer structure as recited in claim 17, wherein said multi-passivation layer structure is a passivation layer for a pentancne transistor.

21. The multi-passivation layer structure as recited in claim 17, wherein said multi-passivation layer structure is a passivation layer for a pentancne transistor.

22. The multi-passivation layer structure as recited in claim 17, wherein said first passivation layer of said multi-passivation layer structure is formed of a water-type solution.

23. The multi-passivation layer structure as recited in claim 17, wherein said second and said third passivation layers of said multi-passivation layer structure is formed of a grease-type solution.

24. The multi-passivation layer structure as recited in claim 17, wherein said second and said third passivation layers of said multi-passivation layer structure is formed of a mixture of a water-type solution and a grease-type solution.

* * * * *